United States Patent
Nakazawa et al.

(10) Patent No.: US 7,098,842 B2
(45) Date of Patent: Aug. 29, 2006

(54) VEHICLE-MOUNTED MILLIMETER WAVE RADAR DEVICE, MILLIMETER WAVE RADAR MODULE, AND MANUFACTURING METHOD THEREOF

(75) Inventors: Terumi Nakazawa, Naka (JP); Yoshiyuki Sasada, Hitachinaka (JP); Shiro Oouchi, Hitachinaka (JP)

(73) Assignee: Hitachi, Ltd., Tokyo (JP)

(*) Notice: Subject to any disclaimer, the term of this patent is extended or adjusted under 35 U.S.C. 154(b) by 0 days.

(21) Appl. No.: 10/681,246

(22) Filed: Oct. 9, 2003

(65) Prior Publication Data

US 2004/0075604 A1    Apr. 22, 2004

(30) Foreign Application Priority Data

Oct. 10, 2002    (JP) .............................. 2002-296872

(51) Int. Cl.
   G01S 13/00    (2006.01)
   G01S 13/88    (2006.01)
(52) U.S. Cl. ......................................... 342/70; 342/175
(58) Field of Classification Search ............ 342/70–73, 342/175; 257/275; 174/52.1
   See application file for complete search history.

(56) References Cited

U.S. PATENT DOCUMENTS 5,657,024 A * 8/1997 Shingyoji et al. ........... 342/175
5,943,558 A * 8/1999 Kim et al. ................... 438/125
5,955,752 A   9/1999 Fukaya et al.
6,130,640 A * 10/2000 Uematsu et al. ............. 342/175
6,249,242 B1 * 6/2001 Sekine et al. ................. 342/70
6,600,103 B1 * 7/2003 Schmidt et al. ............. 174/52.1

FOREIGN PATENT DOCUMENTS

| EP | 0978729 A2 | 9/2000 |
| JP | 07-273237 | 10/1995 |
| JP | 07273237 | 10/1995 |
| WO | WO-0045462 A1 | 8/2000 |
| WO | WO-03040754 A1 | 5/2003 |

* cited by examiner

Primary Examiner—Thomas H. Tarcza
Assistant Examiner—Isam Alsomiri
(74) Attorney, Agent, or Firm—Crowell & Moring LLP

(57) ABSTRACT

An object of the present invention is to provide a millimeter wave radar device and module that provides a hollow structure while assuring adequate moisture resistance.

A multilayer substrate on which at least one millimeter wave MMIC is mounted and a cap for forming a hollow around the MMIC are joined with an adhesive or other similar organic member to obtain a high-frequency characteristic. The resulting assembly is housed in a case and covered with a moisture resistance by a gelled organic resin. The nonairtight structure obtained in this manner permits the use of low-cost members and provides increased productivity.

18 Claims, 4 Drawing Sheets

VEHICLE-MOUNTED MILLIMETER WAVE RADAR DEVICE, MILLIMETER WAVE RADAR MODULE, AND MANUFACTURING METHOD THEREOF

BACKGROUND OF THE INVENTION

The present invention relates to a vehicle-mounted millimeter wave radar device, millimeter wave radar module, and manufacturing method thereof.

Japanese Application Patent Laid-open Publication No. Hei 7-273237A discloses the semiconductor device in which a hollow is provided around an IC chip and sealed with a structure composed of a first cap, a molded resin, and a second cap. The molded resin is cured by baking after it is covered with the second cap. Since the device has the hollow around the IC chip, it is possible to prevent IC bonding wires from being cut by thermal stress caused by plastic molding. Furthermore, deterioration of the electrical characteristic can be prevented in comparison with a device in which the IC chip is directly covered by resin, by making a hollow structure around the IC chip.

In a high frequency or other millimeter wave radar RF (Radio Frequency) module, the above conventional technology provides a hollow structure to prevent deterioration in the millimeter wave electrical characteristic. However it fails to assure adequate moisture resistance, and it cannot provide a low-cost millimeter wave radar RF module.

SUMMARY OF THE INVENTION

An object of the present invention is to provide a millimeter wave radar device and module that provides a hollow structure while assuring adequate moisture resistance.

The above object is achieved by a vehicle-mounted millimeter wave radar device that comprises a millimeter wave generation means for generating millimeter waves, an antenna means for sending out the millimeter waves, a substrate that is provided with wiring and the millimeter wave generation means, an enclosure that is joined to the substrate to enclose the millimeter wave generation means and the surrounding space on the substrate in cooperation with the substrate, and a resin that covers the joint between the enclosure and the substrate at least.

A multilayer substrate on which at least one MMIC (Monolithic Microwave Integrated Circuit) for a millimeter wave radar is mounted and a cap for forming a hollow around the MMIC are joined together with an adhesive or other similar organic member to obtain a high-frequency characteristic. The resulting assembly is housed in a case and covered with a moisture resistance by a gelled organic resin. The nonairtight structure obtained in this manner permits the use of low-cost members and provides increased productivity.

Further, the above object is achieved by a method for manufacturing a millimeter wave radar module that sends out radar waves generated by at least one MMIC via an antenna pattern. This method comprises the steps of mounting the MMIC on a wired substrate, enclosing the MMIC by joining a cap containing a hollow to the substrate in such a manner as to position the MMIC in the hollow, and covering the joint with a gel.

DESCRIPTION OF THE PREFERRED EMBODIMENTS

Figure 1:
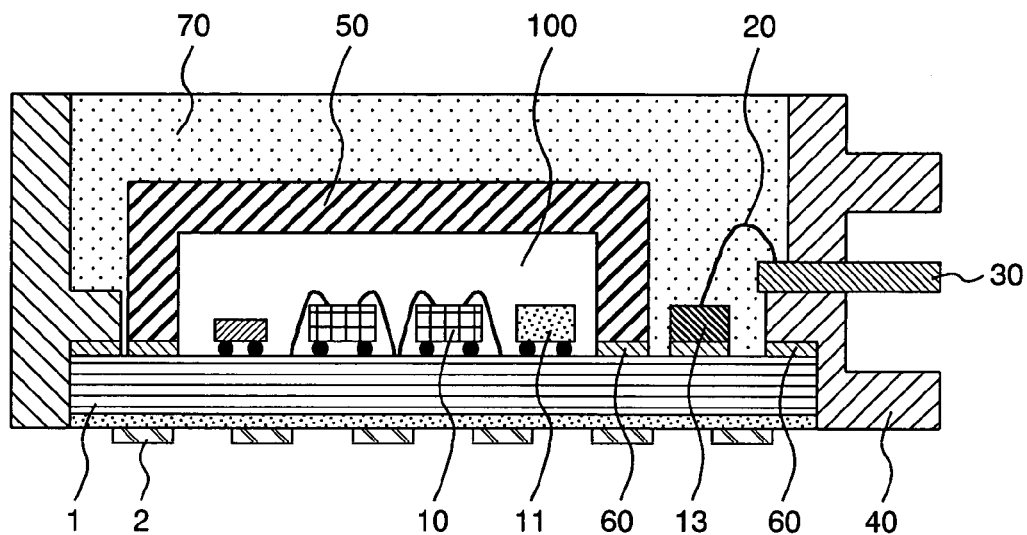
FIG. 1 is a cross-sectional view illustrating the structure of one embodiment of the present invention.

One embodiment of the present invention will now be described with reference to FIG. 1.

A circuit substrate is formed by soldering or wire-bonding MMICs 10, 11 and pads 13 to a multilayer substrate 1, which is formed together with an antenna pattern 2 as one piece. For example, the antenna is comprised of a patch antenna.

A cap 50 is joined to the above circuit substrate with an organic adhesive 60 to make a hollow structure around a circuit section comprised of the MMICs (a millimeter wave generation means) 10, 11.

The hollow structure may be made by performing a juncture process for the cap 50 within nitrogen gas, and be filled with sealing gas 100 of nitrogen gas etc.

Further, the hollow structure may contain a moisture absorbent (not shown) to protect the MMICs from moisture.

A plastic case 40 into which a metal terminal 30 is inserted is joined to a fringe of the multilayer substrate with an organic adhesive 60. In the inside of the plastic case 40, a wire 20 is connected between the pad 13 and the metal terminal 30, and a gel 70 of silicone or the like is filled as a filler except the inside of the cap 50.

The present embodiment, which is configured as described above, has the hollow structure for the MMIC section to provide simple hermetical sealing, retains millimeter waves or other high-frequency electrical characteristic, and effectively uses a gel to provide protection against moisture.

Figure 2:
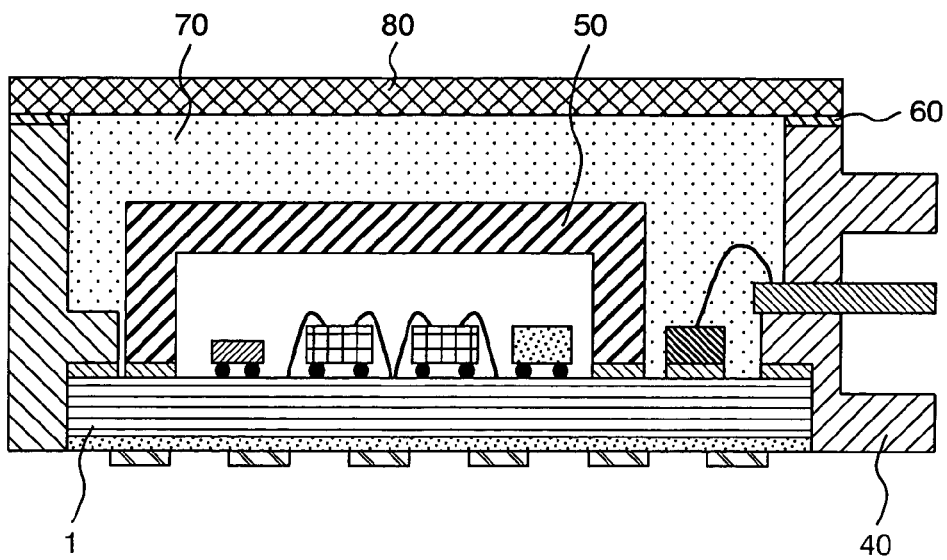
FIG. 2 illustrates another embodiment of the present invention.

FIG. 2 illustrates another embodiment of the present invention. This embodiment differs from the embodiment shown in FIG. 1 in point of joining a plastic cover 80 to the plastic case 40 with an organic adhesive 60. The plastic cover 80 covers an upper opening of the plastic case 40. The present embodiment provides higher moisture resistance than the embodiment shown in FIG. 1.

Figure 3:
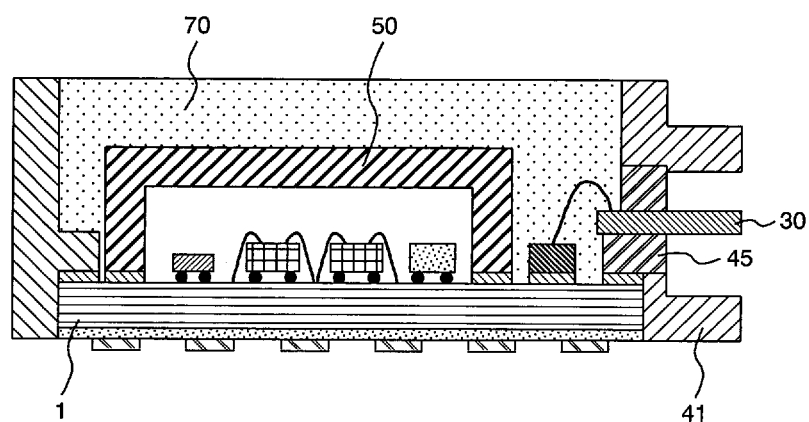
FIG. 3 illustrates another embodiment of the present invention.

FIG. 3 illustrates another embodiment of the present invention. This embodiment differs from the one shown in FIG. 1 in point of using a metal case 41 instead of the plastic case 40 shown in FIG. 1, and using an insulation 45 such as glass to insulate a metal terminal 30 from a metal case 41. The use of this configuration reduces the thermal linear expansion coefficient difference between the multilayer substrate 1 and metal case 41. Consequently, no crack may arise between the multilayer substrate 1 and the metal case 41 due to thermal stress of temperature cycle etc., and increases the moisture resistance.

Figure 4:
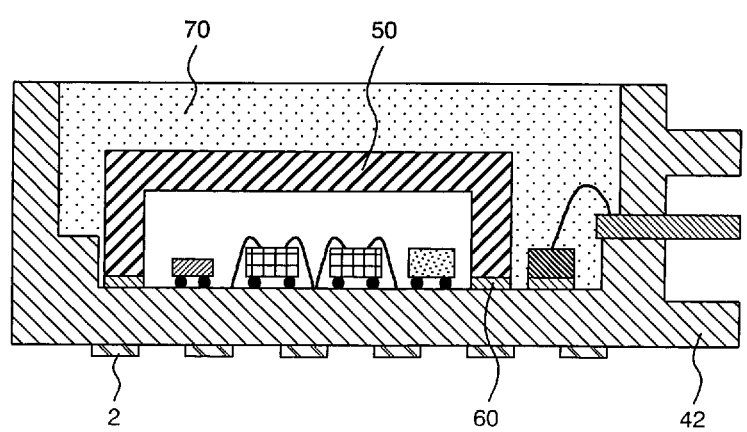
FIG. 4 illustrates another embodiment of the present invention.

FIG. 4 illustrates another embodiment, which differs from the embodiments shown in FIGS. 1 to 3 in that the multilayer substrate 1 and the case (40 or 41) are combined into a single unit 42 instead of being separated from each other.

The use of the above configuration reduces the cost.

It is preferable that the above combined single unit 42 be made of an organic material due to cost considerations. However, it may also be made of an inorganic material.

Figure 5:
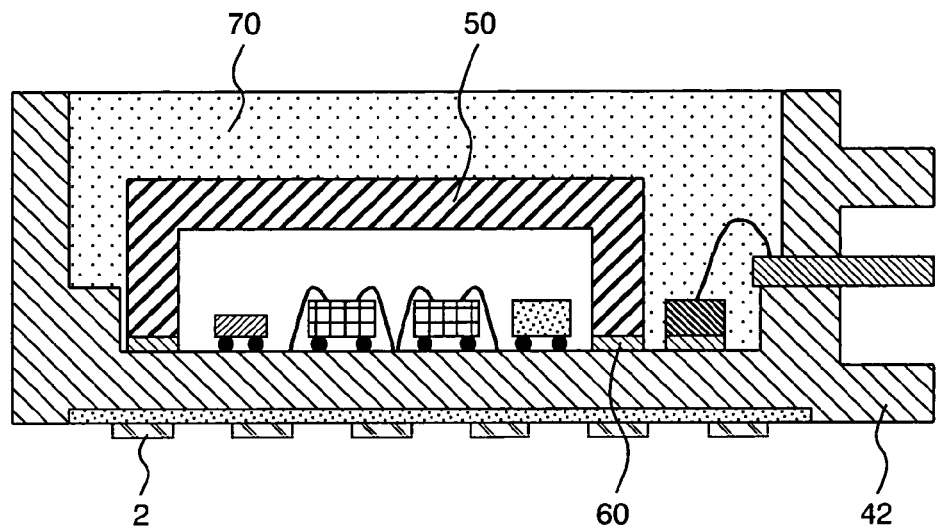
FIG. 5 illustrates another embodiment of the present invention.

FIG. 5 illustrates another embodiment, which differs from the embodiment shown in FIG. 4 in that a separate structure is employed for the antenna pattern 2. That is, a substrate which carries the antenna pattern 2a is formed separately from the case 42. This configuration increases the flexibility of the design for antenna characteristic.

Figure 6:
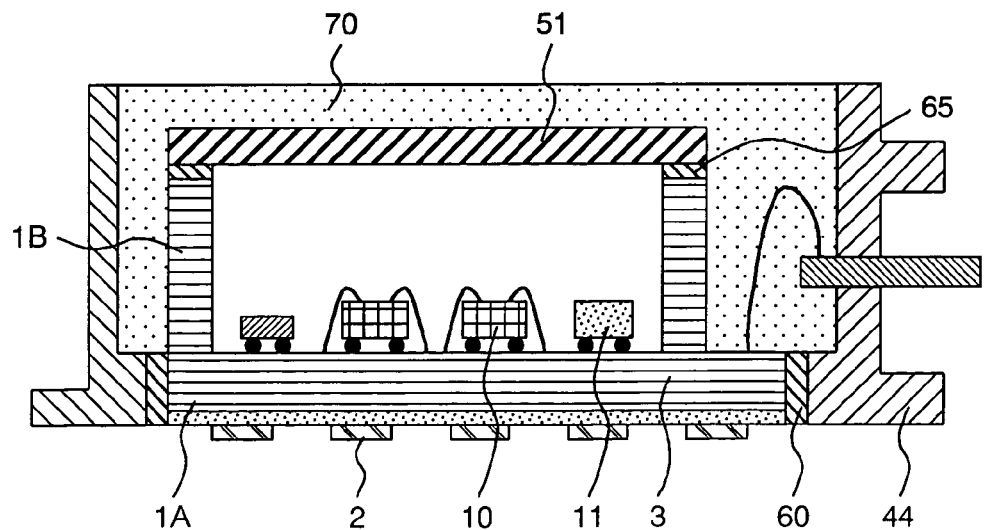
FIG. 6 illustrates another embodiment of the present invention.

FIG. 6 illustrates another embodiment in which an inorganic multilayer substrate 3 is manufactured by using a multilayer substrate 1A and its member 1B. The member 1B is constituted with same material as multilayer substrate 3. The member 1B constitutes a wall for making a hollow structure around the MMICs 10, 11. A metal cover 51 is joined to the member 1B with brazing filler metal 65 such as solder etc. to seal the hollow structure keeping airtight. That is, the member 1B and the metal cover 51 are used instead of the cap 50 shown in FIG. 1 to FIG. 5.

Figure 7:
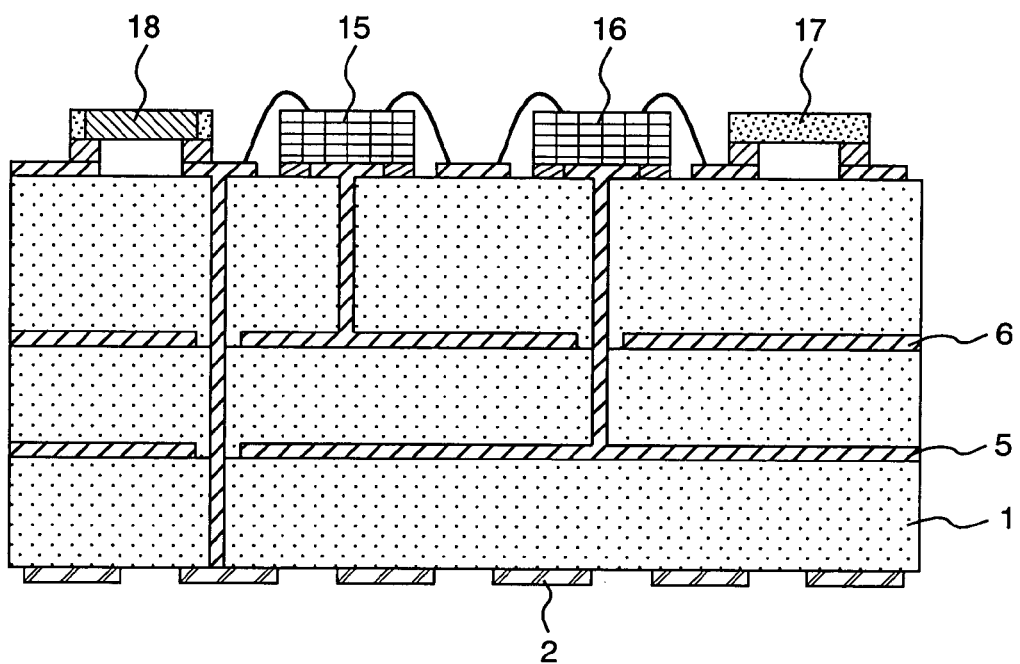
FIG. 7 illustrates one embodiment of a multilayer substrate that is used in a configuration for the present invention.

FIG. 7 illustrates one embodiment of a multilayer substrate 1. An MMIC chip 15, a microcomputer chip 16, a clock oscillator 17, and a filter capacitor 18 are mounted on the multilayer substrate 1. Further, signal separation is provided, for instance, for an analog signal ground 6 and a digital signal ground 5. The opposite surface of the multilayer substrate 1 is provided with an antenna pattern 2.

The above configuration makes it possible to turn the whole millimeter wave radar into a module.

The present invention, which has been described above, provides good electrical characteristic of millimeter waves since it can make a hollow structure around MMICs on a multilayer substrate. Furthermore, since the entire space within a case which houses electric parts is covered with a gelled organic resin which has moisture resistance, it is possible to provide a low-cost millimeter wave radar RF module having increased productivity while maintaining the millimeter wave electrical characteristic even though airtightness is not assured.

What is claimed is:

1. A method for manufacturing a millimeter wave radar module that sends out radar waves generated by at least one MMIC via an antenna pattern, the method comprising the steps of:
   mounting said MMIC on a substrate with wiring;
   enclosing said MMIC by joining a cap to said substrate in such a manner as to form a first enclosure which surrounds said MMIC; and
   covering the joint between said cap and said substrate at least with a moisture resistant gel; wherein,
   said substrate is provided with a wall that separates said first enclosure from a second enclosure that surrounds said first enclosure; and
   said gel is filled into said second enclosure after joining said cap to said substrate.

2. A vehicle-mounted radar, comprising:
   a substrate;
   an electronic circuit mounted on said substrate to generate millimeter waves;
   a cover that is joined to said substrate and forms a space on said substrate to contain said electronic circuit therein;
   an antenna for sending out said millimeter waves and receiving their reflected waves;
   a case that is combined with said substrate to form a recess for containing a joint between said cover and said substrate; and
   a moisture resistant resin which is filled around said joint between said cover and said substrate in said recess.

3. The vehicle-mounted radar according to claim 2, wherein said antenna is provided on a surface of said substrate opposite to the surface on which said electronic circuit is mounted.

4. The vehicle-mounted radar according to claim 2, wherein said space is filled with an inert gas.

5. The vehicle-mounted radar according to claim 2, further comprising another cover for covering an opening of said case.

6. The vehicle-mounted radar according to claim 2, wherein said substrate is integral with said case.

7. The vehicle-mounted radar according to claim 2, wherein said electronic circuit is mounted on said substrate within said space.

8. A millimeter wave radar module comprising:
   a multi-layer substrate;
   a patch antenna circuit formed on a portion of a surface of said multi-layer substrate;
   at least one MMIC mounted on a remaining portion of said surface of said multi-layer substrate;
   a cap that is joined to said multi-layer substrate and forms a space on said multi-layer substrate to contain said MMIC;
   a case that is combined with said multi-layer substrate to form a recess for containing a joint between said cap and said multi-layer substrate; and
   a moisture resistant resin which is filled around said joint around said joint between said cap and said multi-layer substrate in said recess.

9. The millimeter wave radar module according to claim 8, further comprising input/output signal terminals provided through said case, wherein:
   said case is made of a conductive material;
   a circumference of said input/output signal terminals is made of an insulation material; and
   said input/output signal terminals are put through said case with said insulation material.

10. The millimeter wave radar module according to claim 8, wherein said multi-layer substrate is integral with said case.

11. The millimeter wave radar module according to claim 8, wherein said patch antenna circuit is formed on a separate member, and said member is attached to said multi-layer substrate.

12. The millimeter wave radar module according to claim 8, wherein:
   said multi-layer substrate is non-planar, and is shaped so as to contain a space; and
   a flat cover is joined to said multi-layer substrate so as to form said recess for said MMIC.

13. The millimeter wave radar module according to claim 8, wherein said space is filled with an inert gas.

14. The millimeter wave radar module according to claim 8, wherein said multi-layer substrate is made of either an inorganic material or an organic material.

15. The millimeter wave radar module according to claim 8, wherein said cap and said multi-layer substrate are joined by an organic material using as an adhesive.

16. The millimeter wave radar module according to claim 8, wherein said moisture resistance resin is a gelled organic resin.

17. A method for manufacturing a radar module that sends out radar waves generated by at least one MMIC via an antenna pattern, the method comprising the steps of:
   mounting said MMIC on a substrate with wiring;
   forming an enclosure about said MMIC by joining a cap to said substrate in such a manner as to position said MMIC in said enclosure;
   providing a recess containing a joint between said cap and said substrate by attaching a case to said substrate;
   filling said recess with a moisture resistant resin.

18. The method according to claim 17, wherein said joining is performed in a nitrogen gas atmosphere.

* * * * *